(12) United States Patent
Tamanuki et al.

(10) Patent No.: US 7,559,703 B2
(45) Date of Patent: Jul. 14, 2009

(54) OPTICAL MODULE AND DATA COMMUNICATION SYSTEM INCLUDING THE OPTICAL MODULE

(75) Inventors: Takemasa Tamanuki, Torrance, CA (US); Chris Keller, Torrance, CA (US)

(73) Assignee: Ibiden Co., Ltd., Ogaki-shi (JP)

( * ) Notice: Subject to any disclaimer, the term of this patent is extended or adjusted under 35 U.S.C. 154(b) by 481 days.

(21) Appl. No.: 11/225,048

(22) Filed: Sep. 14, 2005

(65) Prior Publication Data

US 2007/0058981 A1 Mar. 15, 2007

(51) Int. Cl.
*G02B 6/36* (2006.01)
*G02B 6/12* (2006.01)
*G02B 6/26* (2006.01)
*G02B 6/32* (2006.01)
*G02B 6/34* (2006.01)
*G02B 6/30* (2006.01)
*H04B 10/12* (2006.01)
*H04B 10/00* (2006.01)

(52) U.S. Cl. .............. 385/89; 385/14; 385/15; 385/16; 385/17; 385/18; 385/19; 385/32; 385/33; 385/34; 385/36; 385/49; 385/88; 385/92; 385/93; 385/94; 398/141; 398/156

(58) Field of Classification Search .............. 385/14, 385/32–34, 36, 49, 88, 89, 92, 93
See application file for complete search history.

(56) References Cited

U.S. PATENT DOCUMENTS 5,535,296 A 7/1996 Uchida
5,687,267 A 11/1997 Uchida
5,818,997 A * 10/1998 Fasanella et al. ............ 385/147

(Continued)

FOREIGN PATENT DOCUMENTS

EP 0 704 732 A1 4/1996

(Continued)

OTHER PUBLICATIONS

U.S. Appl. No. 11/046,875, filed Feb. 1, 2005, Tamanuki et al.

(Continued)

*Primary Examiner*—Charlie Peng
*Assistant Examiner*—Hung Lam
(74) *Attorney, Agent, or Firm*—Oblon, Spivak, McClelland, Maier & Neustadt, P.C.

(57) ABSTRACT

An optical module includes a fiber array, a laser diode array, a photodiode array and a micro-lens array. The fiber array includes optical fibers which are divided to a transmitter group and a receiver group. The laser diode array includes laser diodes which are grouped in a transmitter group. The photodiode array includes photodiodes which are divided to a monitor group and a receiver group. The laser diode array is provided between the fiber array and the photodiode array. The optical fibers of the transmitter group are optically aligned with the laser diodes of the transmitter group, respectively. The micro-lens array is provided between the laser diode array and the photodiode array, and optically aligns the laser diodes of the transmitter group and the optical fibers of the receiver group with the photodiodes of the monitor group and the photodiodes of the receiver group, respectively.

5 Claims, 7 Drawing Sheets

U.S. PATENT DOCUMENTS

| | | | |
|---|---|---|---|
| 5,883,988 A * | 3/1999 | Yamamoto et al. | 385/14 |
| 5,974,064 A | 10/1999 | Uchida | |
| 6,529,652 B1 * | 3/2003 | Brener | 385/16 |
| 6,905,257 B2 | 6/2005 | Eichenberger et al. | |
| 2002/0114590 A1 | 8/2002 | Eichenberger et al. | |

FOREIGN PATENT DOCUMENTS

| | | |
|---|---|---|
| EP | 1 143 278 A2 | 10/2001 |
| EP | 1 237 026 A2 | 9/2002 |
| EP | 1 053 575 B1 | 9/2004 |
| JP | 8-179171 | 7/1996 |
| JP | 2001-141969 | 5/2001 |
| JP | 2002/511658 | 4/2002 |
| JP | 2002-311310 | 10/2002 |
| WO | WO 99/53577 | 10/1999 |

OTHER PUBLICATIONS

U.S. Appl. No. 11/099,522, filed Apr. 6, 2005, Tamanuki et al.

U.S. Appl. No. 11/225,048, filed Sep. 14, 2005, Tamanuki et al.

* cited by examiner

OPTICAL MODULE AND DATA COMMUNICATION SYSTEM INCLUDING THE OPTICAL MODULE

BACKGROUND OF THE INVENTION

1. Field of the Invention

The present invention relates to an optical module and a data communication system including the optical module.

2. Discussion of the Background

A conventional optical module, which transmits and receives optical signals through an optical fiber array, utilizes a right-angle-micro-lens array, for example, manufactured by Omron Corporation (e.g., Model No. P1L12C) to change at a 90 degree angle a direction of optical axes of incident optical signals emitted from the optical fiber array or from a vertical cavity surface emitted laser diode array.

SUMMARY OF THE INVENTION

According to one aspect of the present invention, an optical module includes a fiber array, a laser diode array, a photodiode array and a micro-lens array. The fiber array includes optical fibers which are divided to a transmitter group and a receiver group. The laser diode array includes laser diodes which are grouped in a transmitter group. The photodiode array includes photodiodes which are divided to a monitor group and a receiver group. The laser diode array is provided between the fiber array and the photodiode array. The optical fibers of the transmitter group are optically aligned with the laser diodes of the transmitter group, respectively. The micro-lens array is provided between the laser diode array and the photodiode array. The micro-lens array optically aligns the laser diodes of the transmitter group and the optical fibers of the receiver group with the photodiodes of the monitor group and the receiver group, respectively.

According to another aspect of the present invention, a data communication system includes an optical module which has a fiber array, a laser diode array, a photodiode array and a micro-lens array. The fiber array includes optical fibers which are divided to a transmitter group and a receiver group. The laser diode array includes laser diodes which are grouped in a transmitter group. The photodiode array includes photodiodes which are divided to a monitor group and a receiver group. The laser diode array is provided between the fiber array and the photodiode array. The optical fibers of the transmitter group are optically aligned with the laser diodes of the transmitter group, respectively. The micro-lens array is provided between the laser diode array and the photodiode array. The micro-lens array optically aligns the laser diodes of the transmitter group and the optical fibers of the receiver group with the photodiodes of the monitor group and the receiver group, respectively.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
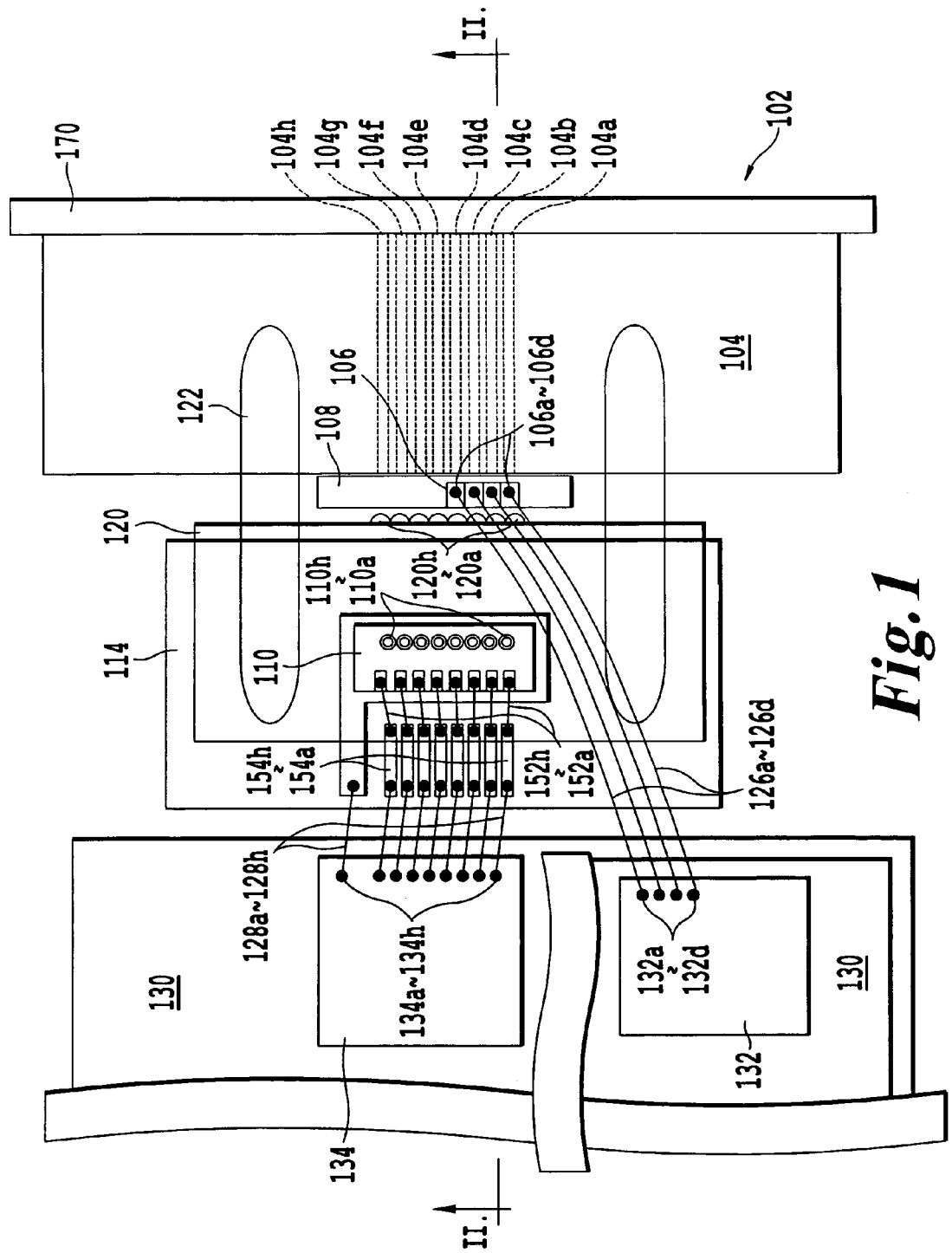
FIG. 1 is a plan view of an optical module according to an embodiment of the present invention.

The embodiments will now be described with reference to the accompanying drawings, wherein like reference numerals designate corresponding or identical elements throughout the various drawings.

Figure 2:
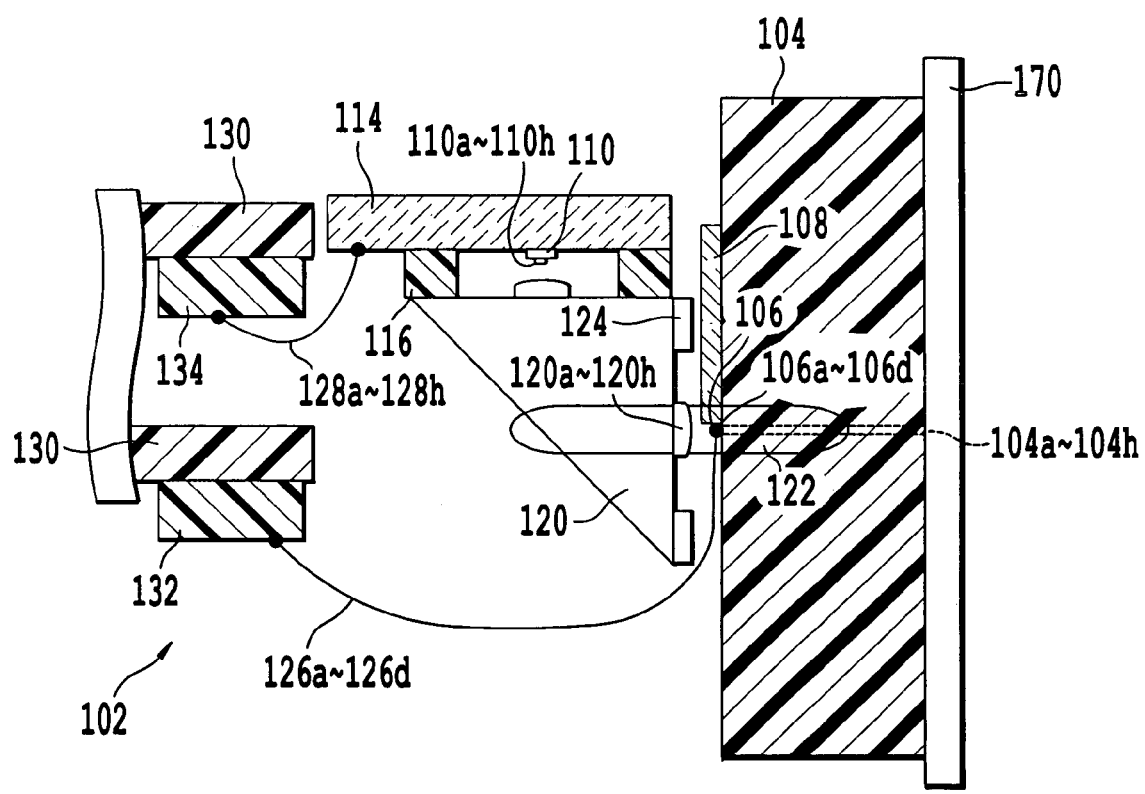
FIG. 2 is a cross sectional view of the optical module cut along the line II-II of FIG. 1.

FIGS. 1 and 2 show an optical module according to an embodiment of the present invention. Referring to FIGS. 1 and 2, the optical module 102 includes, a multi-channel, for example, 8-channel fiber array 104, a multi-channel, for example, 4-channel laser diode array 106, a laser diode submount 108, a multi-channel, for example, 8-channel photodiode array 110, a photodiode submount 114, a micro-lens array 120 with plural channels, for example, a right-angle-micro-lens array with 8 micro-lens channels.

The fiber array 104 has fiber ends 170 at one end surface. Another end surface of the fiber array 104 is provided with the laser diode submount 108 on which the laser diode array 106 is provided. The right-angle-micro-lens array 120 is connected to the fiber array 104 by at least one guide pin 122, two guide pins for example, to sandwich the laser diode array 106. The photodiode array 110 is provided on the photodiode submount 114. The photodiode submount 114 and the right-angle-micro-lens array 120 are positioned to sandwich the photodiode array 110. The laser diode submount and the photodiode submount are made of ceramic, for example. The fiber array 104, the laser diode array 106, the right-angle-micro-lens array 120 and the photodiode array 110 are optically aligned, respectively.

Further, as shown in FIG. 2, at least one spacer 116 is provided between the right-angle-micro-lens array 120 and the photodiode submount 114 to provide space for the photodiode array 110. At least one protrusion 124 is provided with the right-angle-micro-lens array 120 and between the right-angle-micro-lens array 120 and the fiber array 104. The protrusion 124 is provided to protect micro-lenses of the right-angle-micro-lens array 120 and to adjust the focal length thereof. According to the embodiment of the present invention in FIG. 2, the thickness of the protrusion 124 in a direction of an optical alignment of the fiber array 110 with the right-angle-micro-lens array 120 is, for example, 0.4 mm.

The fiber array 104 includes first to fourth optical fibers 104a-104d of a transmitter group, and fifth to eighth optical fibers 104e-104h of a receiver group. The laser diode array 106 includes first to fourth laser diodes 106a-106d of a transmitter group. The photodiode array 110 includes first to fourth photodiodes 110a-110d of a monitor group, and fifth to eighth photodiodes 110e-110h of a receiver group. The right-angle-micro-lens array 120 includes first to fourth micro-lens channel 120a-120d of a transmitter group and fifth to eighth micro-lens channel 120e-120h of a receiver group.

Electrical circuits 130 are provided with a transmitter circuit 132 and a receiver circuit 134 both provided with electrical pads. Laser diode lead wires 126a-126d electrically connect the laser diodes 106a-106d to electrical pads 132a-132d of the transmitter circuit 132, respectively, to supply electrical currents and to receive electrical signals. The transmitter circuit 132 controls the laser diodes 106a-106d to emit optical signals according to electrical signals which are sent to the transmitter circuit 132 through the electrical circuits 130.

Figure 3:
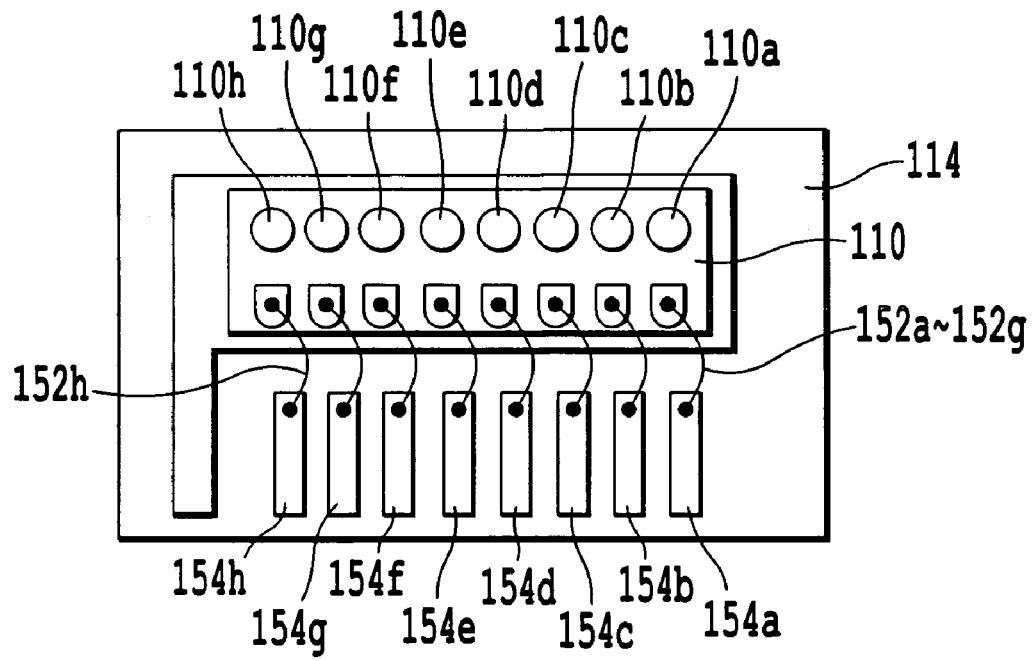
FIG. 3 is a plan view of a photodiode submount with photodiodes according to an embodiment of the present invention.

The photodiode submount 114 is provided with traces 154a-154h (also shown in FIG. 3). Trace wires 152a-152h electrically connect the photodiodes 110a-110h of the photodiode array 110 to the traces 154a-154h, respectively. Photodiode lead wires 128a-128h electrically connect the traces 154a-154h to electrical pads 134a-134h of the receiver circuit 134, respectively, to supply electrical currents and to receive electrical signals. The photodiodes 110a-110d of the monitor group receive optical signals emitted from the laser diodes 106a-106d of the transmitter group, and output received optical signals to the transmitter circuit 132 to perform feed back control of the laser diodes 106a-106d. The photodiodes 110e-110h of the receiver group receive optical signals transmitted via the optical fibers 104e-104h of the receiver group, convert received optical signals to electrical signals, and output the electrical signals to the receiver circuit 134.

The fiber array 104, the laser diode array 106, the right-angle-micro-lens array 120, and the photodiode array 110 are arranged such that the first to fourth optical fibers 104a-104d of the transmitter group, the first to fourth laser diodes 106a-106d of the transmitter group, the first to fourth micro-lens channels 120a-120d of the transmitter group, and the first to fourth photodiodes 110a-110d of the monitor group are optically aligned, respectively, and such that the fifth to eighth optical fibers 104e-104h of the receiver group, the fifth to eighth micro-lens channels 120e-120h of the receiver group, and the fifth to eighth photodiodes 110e-110h of the receiver group are optically aligned, respectively.

According to this embodiment of the present invention, each micro-lens of the right-angle-micro lens array 120 has, for example, a diameter of 240 μm, a focal length of 400 μm, and accordingly a numerical aperture of 0.3 (i.e., Numerical Aperture=(Diameter/2)/Focal Length). Because of such a limited numerical aperture, the right-angle-micro-lens array 120 effectively reduces optical crosstalk between optical signals emitted from the laser diodes 106a-106d of the transmitter group to be monitored by the photodiodes 110a-110d of the monitor group. The right-angle-micro-lens array 120 also reduces optical crosstalk between optical signals emitted from the laser diodes 106a-106d of the transmitter group to be monitored by the photodiodes 110a-110d of the monitor group and optical signals emitted from the optical fibers 104e-104h of the receiver group of the fiber array 104 to be received by the photodiodes 110e-110h of the receiver group. As a result, the optical signals emitted from each laser diode of the transmitter group and emitted from each optical fiber of the receiver group are accurately received by corresponding photodiode of the photodiode array 110.

Moreover, as shown in Fig, 2, the right-angle-micro-lens array 120 effectively separates the photodiode lead wires 128a-128h from the laser diode lead wires 126a-126d; therefore, electrical crosstalk between the photodiode lead wires 128a-128h and the laser diode lead wires 126a-126d is reduced. As a result, the electrical circuits 130 receive accurate electrical signals via the photodiode lead wires 128a-128h and via the laser diode lead wires 126a-126d.

Further, because the right-angle-micro-lens array 120 and the fiber array 104 are connected by at least one guide pin 122, the two guide pins for example, the right-angle-micro-lens array 120 is precisely positioned to be in optical alignment with the laser diode array 106 and the fiber array 104. As a result, the right-angle-micro-lens array 120 stabilizes transmission and reception of optical signals and electrical signals in the optical module 102.

As shown in FIG. 2, the right-angle-micro-lens array 120 in this embodiment has a prism which reflects incident optical signals at a 90 degree angle. Thus, in the right-angle-micro-lens array 120, a direction of optical axes of incident optical signals emitted from the laser diodes 106a-106d of the transmitter group and emitted from the optical fibers 104e-104h of the receiver group is changed at a 90 degree angle. Accordingly, optical axes of the photodiodes 110a-110h are positioned at a 90 degree angle with respect to the optical axes of the incident optical signals emitted from the laser diodes 106a-106d of the transmitter group and emitted from the optical fibers 104e-104h of the receiver group, respectively. Such positioning of the photodiodes 110a-110h allows a surface of the photodiode submount 114, which faces the right-angle-micro-lens array 120 and on which the photodiode array 110 with the photodiodes 110a-110h is provided, to be positioned substantially perpendicular to an end surface of the fiber array 104, on which the laser diode submount 108 with the laser diode array 106 is provided.

Figure 4:
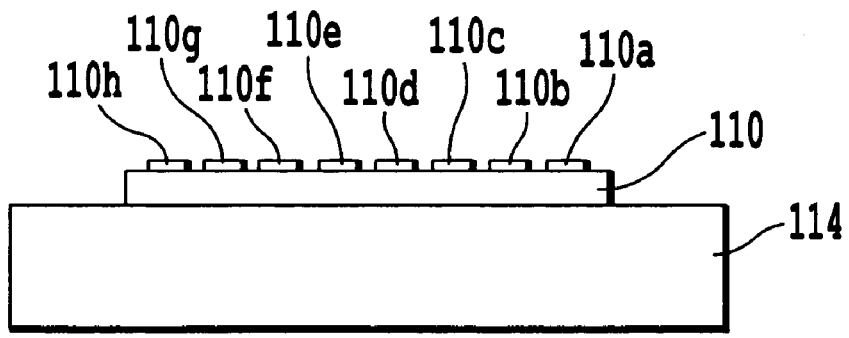
FIG. 4 is a side view of the photodiode submount in FIG. 3.

Consequently, as shown in FIGS. 1 and 2, the surface of the photodiode submount 114, which is positioned substantially perpendicular to the end surface of the fiber array 104, allows both the traces 154a-154h and the photodiode array 110 to be provided only on that single surface of the photodiode submount 114 (see also FIGS. 3 and 4). Therefor, this embodiment of the present invention utilizes, as the photodiode submount 114, a submount provided with traces on a single surface of the submount, as shown in FIGS. 3 and 4, which is less expensive than a submount provided with traces on at least two surfaces of the submount. As a result, structures of the optical module 102 are simplified, and manufacturing costs of the optical module 102 are reduced.

Figure 5:
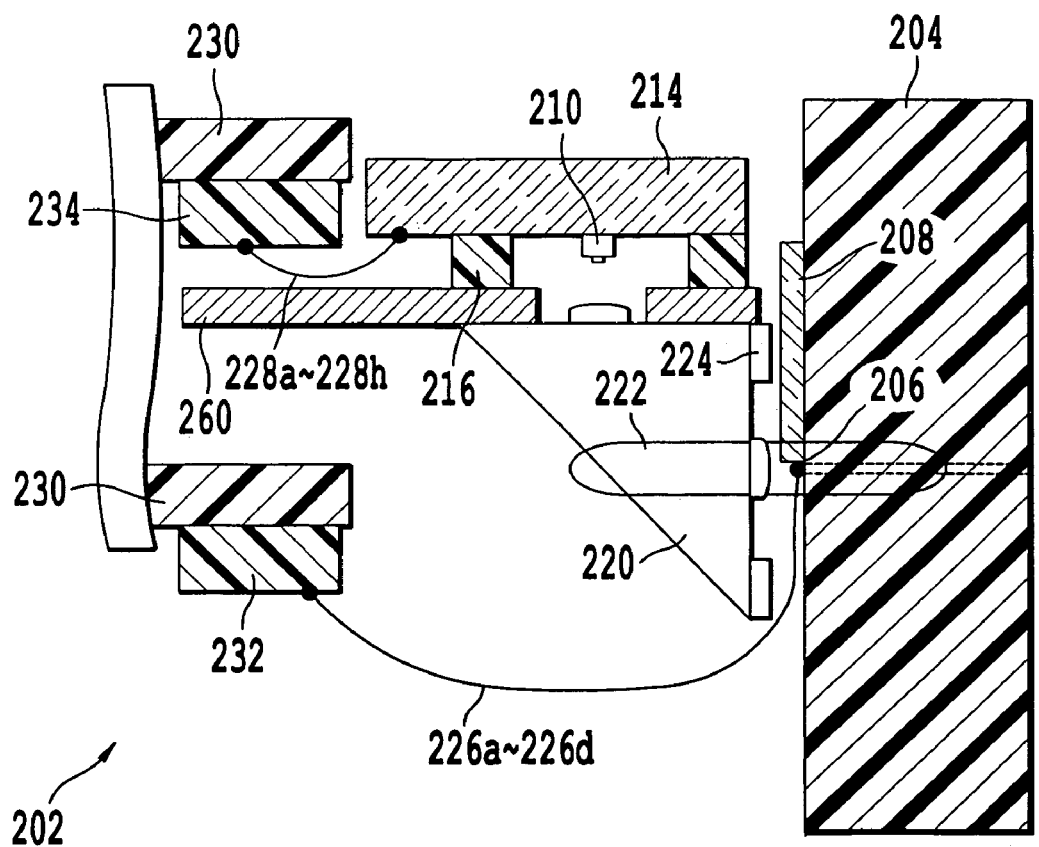
FIG. 5 is a side view of an optical module according to an embodiment of the present invention.

FIG. 5 shows an optical module according to an embodiment of the present invention which includes a shield metal. Referring to FIG. 5, the optical module 202 includes, a multi-channel, for example, 8-channel fiber array 204, a multi-channel, for example, 4-channel laser diode array 206, a laser diode submount 208, a multi-channel, for example, 8-channel photodiode array 210, a photodiode submount 214, at least one spacer 216, a micro-lens array 220 with plural channels, for example, a right-angle-micro-lens array with 8 micro-lens channels, at least one guide pin 222, and the shield metal 260. The right-angle-micro-lens array 220 is provided with at least one protrusion 224.

The shield metal 260 is provided on a surface of the right-angle-micro-lens array 220, and provided near photodiode lead wires 228a-228h which connect traces on the photodiode submount 214 to a receiver circuit 234 of electrical circuits 230. The shield metal 260 is provided between the photodiode array 210 and the right-angle-micro-lens array 220, and sandwiched by the photodiode submount 214 and the right-angle-micro-lens array 220. The shield metal 260 may be provided between the laser diode array 206 and the right-angle-micro-lens array 220, and sandwiched by the laser diode submount 208 and the right-angle-micro-lens array 220. Laser diode lead wires 226a-226d connect the laser diode array 206 to a transmitter circuit 232 of the electrical circuits 230.

According to this embodiment of the present invention, the shield metal 260 prevents electrical crosstalk between the photodiode lead wires 228a-228h and the laser diode lead wires 226a-226d so that the accuracy of electrical signals which the receiver circuit 234 receives from the photodiode array 210 via the photodiode lead wires 228a-228h is increased. As a result, the shield metal 260 stabilizes transmission and reception of optical signals and electrical signals in the optical module 202.

Figure 6:
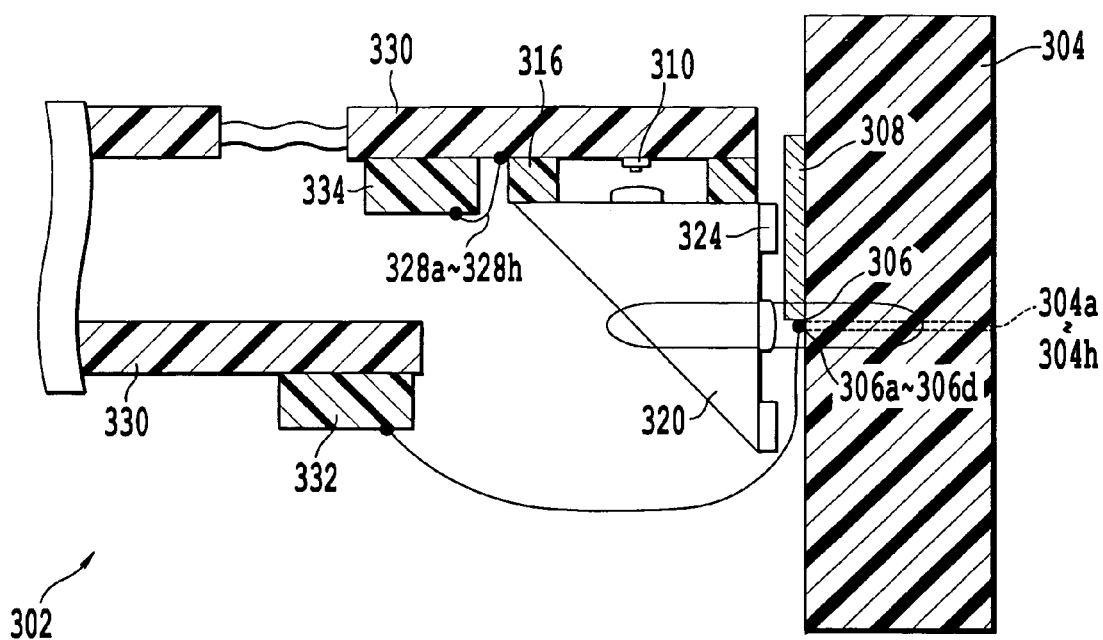
FIG. 6 is a side view of an optical module according to an embodiment of the present invention.

FIG. 6 shows an optical module according to an embodiment of the present invention which includes flexible electrical circuits. Referring to FIG. 6, the optical module 302 includes a multi-channel fiber array 304, a multi-channel laser diode array 306, a laser diode submount 308, a multi-channel photodiode array 310, at least one spacer 316, a right-angle-micro-lens array 320 with at least one protrusion 324, and the flexible electrical circuits 330. The flexible electrical circuits 330 replace a photodiode submount and are provided with the photodiode array 310 as well as a transmitter circuit 332 and a receiver circuit 334.

Because the right-angle-micro-lens array 320 changes a direction of optical axes of incident optical signals at a 90 degree angle, the photodiode array 310 is positioned on the flexible electrical circuits 330 so that optical axes of the plural photodiodes are positioned at a 90 degree angle with respect to optical axes of incident optical signals emitted from laser diodes 306a-306d of a transmitter group of the laser diode array 306 and emitted from optical fibers 304e-304h of a receiver group of the fiber array 304. Thus, the right-angle-micro-lens array 320 optically aligns the photodiode array 310 with the transmitter group of the laser diode array 306 and the receiver group of the fiber array 304. Accordingly, a surface of the flexible electrical circuits 330 with the photodiode array 310 is positioned substantially perpendicular to an end surface of the fiber array 304 which faces the right-angle-micro-lens array 320. This positioning of the surface of the flexible electrical circuits 330 allows both the photodiode array 310 and traces for photodiode lead wires 328a-328h to be provided only on a single surface of the flexible electrical circuits 330.

Therefore, the optical module 302 according to this embodiment of the present invention utilizes the flexible electrical circuits 330 to eliminate a need of a photodiode submount, and to eliminate a need of electrical circuits provided with traces on at least two surfaces of each of the electrical circuits. As a result, the optical module 302 is manufactured with fewer parts, simplified in structures, and manufactured at reduced costs.

Figure 7:
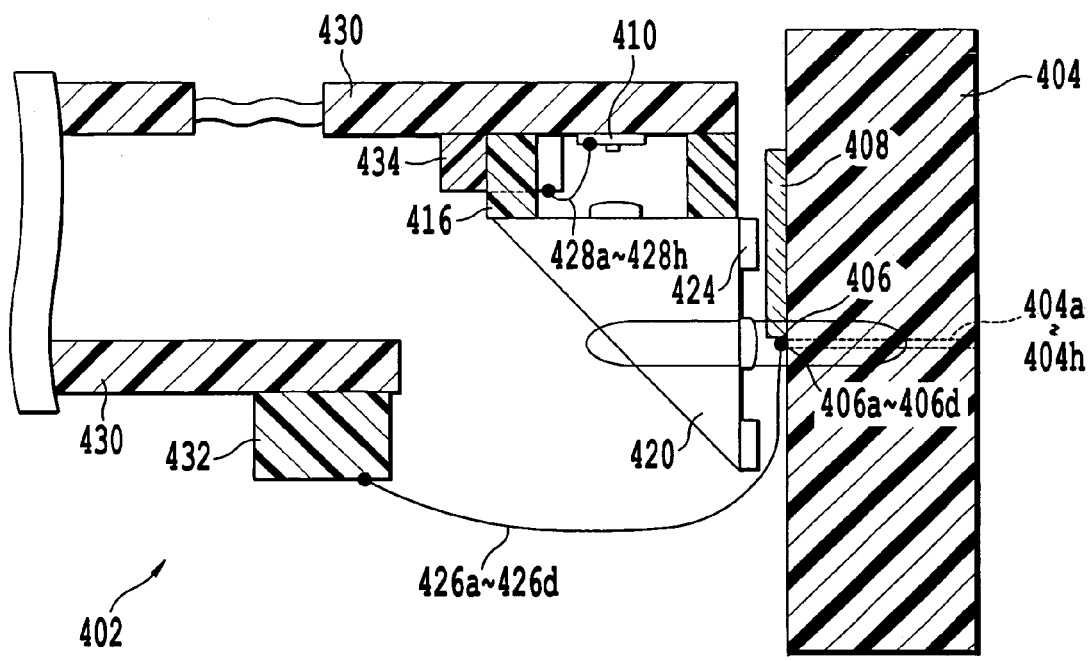
FIG. 7 is a side view of an optical module according to an embodiment of the present invention.

FIG. 7 shows an optical module according to an embodiment of the present invention which includes a receiver circuit sandwiched between flexible electrical circuits and a micro-lens array. Referring to FIG. 7, the optical module 402 includes a multi-channel fiber array 404, a multi-channel laser diode array 406, a laser diode submount 408, a multi-channel photodiode array 410, at least one spacer 416, a right-angle-micro-lens array 420 with at least one protrusion 424, and the flexible electrical circuits 430. Similarly to the embodiment in FIG. 6, the flexible electrical circuits 430 replace a photodiode submount and are provided with the photodiode array 410 as well as a transmitter circuit 432 and a receiver circuit 434. Photodiode lead wires 428a-428h electrically connect the photodiode array 410 to the receiver circuit 434.

The photodiode array 410 is provided on the flexible electrical circuits 430 so that optical axes of the photodiode array 410 are positioned at a 90 degree angle with respect to optical axes of incident optical signals emitted into the right-angle-micro-lens array 420 from the laser diode array 406 and the fiber array 404. Thus, the photodiode array 410 is optically aligned with the right-angle-micro-lens array 420, the laser diode array 406 and the fiber array 404. A surface of the flexible electrical circuits 430, which is provided with the photodiode array 410 and the receiver circuit 434, is positioned substantially perpendicular to an end surface of the fiber array 404 which faces the right-angle-micro-lens array 420. As shown in FIG. 7, this positioning of the surface of the flexible electrical circuits 430 allows the receiver circuit 434 to be at least partially sandwiched between the surface of the flexible electrical circuits 430 on which the receiver circuit is provided and the right-angle-micro-lens array 420. Accordingly, the photodiode array 410 and the receiver circuit 434 are positioned close to each other on a single surface of the flexible electrical circuits 430.

Therefore, the optical module 402 according to this embodiment of the present invention utilizes the flexible electrical circuits 430 to eliminate a need of a photodiode submount, and to eliminate a need of electrical circuits provided with traces on at least two surfaces of each of the electrical circuits. As a result, the optical module 402 is manufactured with fewer parts, simplified in structures, and manufactured at reduced costs. Further, because the photodiode array 410 and the receiver circuit 434 are positioned close to each other on a single surface of the flexible electrical circuits 430, the photodiode array 410 and the receiver circuit 434 are connected by very short photodiode lead wires 428a-428h. Consequently, a very short distance between the photodiode array 410 and the receiver circuit 434 reduces electrical cross talk with laser diode lead wires 426a-426d.

Figure 8:
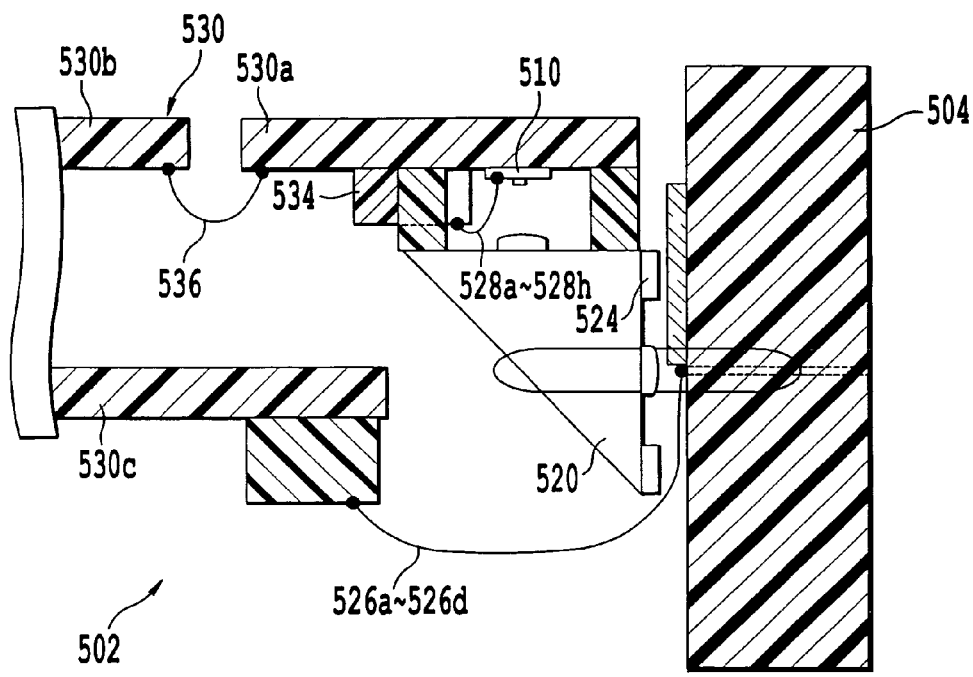
FIG. 8 is a side view of an optical module according to an embodiment of the present invention.

FIG. 8 shows an optical module according to an embodiment of the present invention similar to the embodiment shown in FIG. 7. As shown in FIG. 8, the optical module 502 includes electrical circuits 530 which replace the flexible electrical circuits 430 shown in FIG. 7. The electrical circuits 530 include plural electrical circuits 530a-530c, for example, connected by electrical wires 536. A photodiode array 510 and a receiver circuit 534 are provided on a surface of an electrical circuit 530a. The receiver circuit 534 is at least partially sandwiched by the surface of the electrical circuit 530a and a right-angle-micro-lens array 520. Similarly to the optical module 402 in FIG. 7, the optical module 502 according to this embodiment of the present invention utilizes the electrical circuits 530 to eliminate a need of a photodiode submount, and to eliminate a need of electrical circuits provided with traces on at least two surfaces of each of the electrical circuits.

As a result, the optical module 502 is manufactured with fewer parts, simplified in structures, and manufactured at reduced costs. Further, because the photodiode array 510 and the receiver circuit 534 are positioned close to each other on a single surface of the electrical circuit 530a, the photodiode array 510 and the receiver circuit 534 are connected by very short photodiode lead wires 528a-528h. Consequently, a very short distance between the photodiode array 510 and the receiver circuit 534 reduces electrical cross talk with laser diode lead wires 526a-526d.

Turning back to FIGS. 1 and 2, the optical fibers 104a-104h of the fiber array 104 and the laser diode array 106 are arranged such that a distance between each of end surfaces of the optical fibers 104a-104d of the transmitter group and each corresponding one of the laser diodes 106a-106d of the transmitter group is at least about 10 μm and at most about 50 μm, preferably at least about 20 μm and at most about 30 μm.

According to this embodiment of the present invention, the eight optical fibers 104a-104h, the four laser diodes 106a-

106d, the eight micro-lens channels 120a-120h and the eight photodiodes 110a-110h have substantially equal pitches which are at least about 125 µm. In addition, on a single substrate of the photodiode array 110, the photodiodes 110a-110d of the monitor group and the photodiodes 110e-110h of the receiver group are positioned together, and perform functions of both independent monitoring of the optical output power of each of the laser diodes 106a-106d of the transmitter group, and receiving optical signals from the optical fibers 104e-104h of the receiver group. As a result, for transmitting and receiving optical signals, the number of channels, which are provided with optical output power monitors, is increased within a limited space in the optical module 102. Moreover, structures of the optical module are simplified, and manufacturing costs of the optical module are reduced.

With regard to pitches of fibers and diodes, the pitches between the optical fibers 104a-104h, the laser diodes 106a-106d, the micro-lens channels 120a-120h and the photodiodes 110a-110h may be arranged such that, for example, a pitch within one group of the fiber array 104 is different from a pitch within another group of the fiber array 104, or such that a pitch between the transmitter group and the receiver group of the fiber array 104 is different from a pitch within the transmitter group and the receiver group of the fiber array 104. The laser diodes, the micro-lens channels and the photodiodes may be similarly arranged to the extent applicable.

Further, in this embodiment of the present invention, the combined number of the optical fibers of the transmitter group and the receiver group of the fiber array 104 is eight, which is equal to the combined number of the photodiodes of the monitor group and the receiver group of the photodiode array 110, and equal to the combined number of the micro-lens channels of the transmitter group and the receiver group of the right-angle-micro-lens array 120, and twice the number of the laser diodes of the transmitter group of the laser diode array 106. Moreover, the eight optical fibers 104a-104h are equally divided to the transmitter group and the receiver group; the eight micro-lens channels 120a-120h are equally divided to the transmitter group and the receiver group; and the eight photodiodes 110a-110h are equally divided to the monitor group and the receiver group.

In this regard, the fiber array 104 may have any plural number of optical fibers; may be divided to more groups than the transmitter group and the receiver group; and may be divided to plural groups unevenly. Further, a group or groups other than the transmitter group and the receiver group of the fiber array 104 may have one or more functions different from either or both the transmitter group and the receiver group of the fiber array 104. The right-angle-micro-lens array 120 and the photodiode array 110 may be similarly arranged, as long as each optical fiber of the transmitter group, each corresponding laser diode of the transmitter group, each corresponding micro-lens channel of the transmitter group and each corresponding photodiode of the monitor group are optically aligned, respectively, and as long as each optical fiber of the receiver group, each corresponding micro-lens channel of the receiver group, and each corresponding photodiode of the receiver group are optically aligned, respectively.

Similarly, the laser diode array 106 may have one or more laser diodes; may be divided to more groups than the transmitter group; and may be divided to plural groups unevenly. Further, a group or groups other than the transmitter group of the laser diode array 106 may have one or more functions different from the transmitter group of the laser diode array 106 as long as each optical fiber of the transmitter group, each corresponding laser diode of the transmitter group, each corresponding micro-lens channel of the transmitter group, and each corresponding photodiode of the monitor group are optically aligned, respectively.

Moreover, according to this embodiment of the present invention, the transmitter group and the receiver group of the fiber array 104 are adjacent to each other; the transmitter group and the receiver group of the right-angle-micro-lens array 120 are adjacent to each other; and the monitor group and the receiver group of the photodiode array 110 are adjacent to each other. However, one or more optical fibers or one or more different components of the optical module 102 may be provided between the transmitter group and the receiver group of the fiber array 104. The right-angle-micro-lens array 120 and the photodiode array 110 may be similarly arranged, as long as the fiber array 104, the laser diode array 106, the right-angle-micro-lens array 120 and the photodiode array 110 are optically aligned, respectively.

Figure 9:
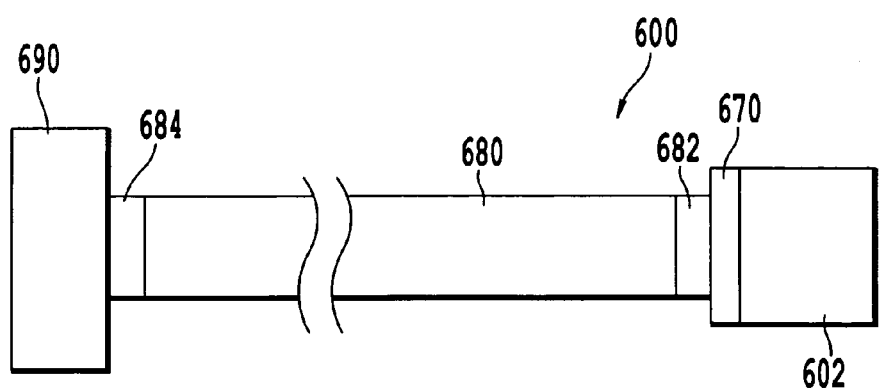
FIG. 9 is showing a data communication system according to an embodiment of the present invention.

FIG. 9 shows a data communication system according to an embodiment of the present invention. Referring to FIG. 9, the data communication system 600 includes at least one optical module 602 according to an embodiment of the present invention, which is for example, one of the optical module 102 shown in FIGS. 1-4, the optical module 202 shown in FIG. 5, the optical module 302 shown in FIG. 6, the optical module 402 shown in FIG. 7, and the optical module 502 shown in FIG. 8. As shown in FIG. 9, fiber ends 670 of the optical module 602 are connected to fiber ends 682 of a communication fiber array 680. Other fiber ends 684 of the communication fiber array 680 are connected to a data communication module 690. The data communication system 600 may include any one of conventional optical modules.

The data communication system 600 may be, for example, an intermediate optical fiber communication system or a part of the intermediate optical fiber communication system. A service provider of the intermediate optical fiber communication system, which has many individual subscribers, may be required to carry, for example, one thousand of optical modules at a node of a base station of the service provider. According to this embodiment of the present invention, because the number of optical fibers is increased within a limited space in the optical module 602, a size of the data communication system 600 is decreased. The data communication system 600 can also be at least a part of, for example, a satellite communication system, a telecommunication system, a visual image communication system or a computer data communication system.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An optical module comprising:
   a fiber array including plural optical fibers which are divided to at least a transmitter fiber group and a receiver fiber group;
   a laser diode array including plural laser diodes which are grouped in at least a transmitter laser diode group;
   a photodiode array including plural photodiodes which are divided to at least a monitor photodiode group and a receiver photodiode group, the laser diode array being provided between the fiber array and the photodiode array, and the plural optical fibers of the transmitter fiber group being optically aligned with the plural laser diodes of the transmitter laser diode group, respectively;

a micro-lens array provided between the laser diode array and the photodiode array, and configured to optically align the plural laser diodes of the transmitter laser diode group and the plural optical fibers of the receiver group with the plural photodiodes of the monitor photodiode group and the plural photodiodes of the receiver photodiode group, respectively; and electrical circuits on which the photodiode array is provided, wherein the electrical circuits have a first surface and include a receiver circuit and plural photodiode lead wires, the photodiode array and the receiver circuit are provided only on the first surface of the electrical circuits, and the plural photodiode lead wires electrically connect the photodiode array to the receiver circuit, and wherein the receiver circuit is at least partially sandwiched between the micro-lens array and the electrical circuits.

2. The optical module according to claim 1, wherein the electrical circuits are flexible electrical circuits.

3. An optical module comprising:

a fiber array including plural optical fibers which are divided to at least a transmitter fiber group and a receiver fiber group;

a laser diode array including plural laser diodes which are grouped in at least a transmitter laser diode group;

a photodiode array including plural photodiodes which are divided to at least a monitor photodiode group and a receiver photodiode group, the laser diode array being provided between the fiber array and the photodiode array, and the plural optical fibers of the transmitter fiber group being optically aligned with the plural laser diodes of the transmitter laser diode group, respectively;

a micro-lens array provided between the laser diode array and the photodiode array, and configured to optically align the plural laser diodes of the transmitter laser diode group and the plural optical fibers of the receiver group with the plural photodiodes of the monitor photodiode group and the plural photodiodes of the receiver photodiode group, respectively; and electrical circuits on which the photodiode array is provided, wherein the electrical circuits include flexible electrical circuits, and the photodiode array is provided on the flexible electrical circuits of the electrical circuits.

4. The optical module according to claim 3, wherein the flexible electrical circuits have a first surface and include a receiver circuit and plural photodiode lead wires, the photodiode array and the receiver circuit are provided only on the first surface of the flexible electrical circuits, and the plural photodiode lead wires electrically connect the photodiode array to the receiver circuit.

5. The optical module according to claim 4, wherein the receiver circuit is at least partially sandwiched between the micro-lens array and the flexible electrical circuits.

* * * * *